(12) United States Patent
Takeda et al.

(10) Patent No.: US 7,456,445 B2
(45) Date of Patent: Nov. 25, 2008

(54) GROUP III NITRIDE SEMICONDUCTOR LIGHT EMITTING DEVICE

(75) Inventors: Hitoshi Takeda, Ichihara (JP); Syunji Horikawa, Tokyo (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 11/597,384

(22) PCT Filed: May 20, 2005

(86) PCT No.: PCT/JP2005/009723

§ 371 (c)(1),
(2), (4) Date: Nov. 22, 2006

(87) PCT Pub. No.: WO2005/114754

PCT Pub. Date: Dec. 1, 2005

(65) Prior Publication Data

US 2007/0228407 A1 Oct. 4, 2007

Related U.S. Application Data

(60) Provisional application No. 60/576,031, filed on Jun. 2, 2004.

(30) Foreign Application Priority Data

May 24, 2004 (JP) .............................. 2004-153854

(51) Int. Cl.
*H01L 29/20* (2006.01)

(52) U.S. Cl. ........................ 257/200; 257/615; 257/745; 257/E21.085; 257/E21.127

(58) Field of Classification Search ....................... None
See application file for complete search history.

(56) References Cited

U.S. PATENT DOCUMENTS

2005/0127394 A1 * 6/2005 Nagahama et al. .......... 257/103

FOREIGN PATENT DOCUMENTS

| CN | 385555 | 3/2000 |
|---|---|---|
| JP | 55-3834 | 1/1980 |
| JP | 4-170397 | 6/1992 |
| JP | 8-23124 A | 1/1996 |
| JP | 2000-244072 A | 9/2000 |
| JP | 2000-332364 | 11/2000 |
| JP | 2003-229645 A | 8/2003 |
| JP | 2004-140020 A | 5/2004 |

* cited by examiner

*Primary Examiner*—Evan Pert
*Assistant Examiner*—Scott R Wilson
(74) *Attorney, Agent, or Firm*—Sughrue Mion, PLLC

(57) ABSTRACT

A Group III nitride semiconductor light emitting device having a light emitting layer (6) bonded to a crystal layer composed of an n-type or p-type Group III nitride semiconductor, the Group III nitride semiconductor light emitting device being characterized by comprising an n-type Group III nitride semiconductor layer (4) having germanium (Ge) added thereto and having a resistivity of $1 \times 10^{-1}$ to $1 \times 10^{-3}$ $\Omega$cm. The invention provides a Ge-doped n-type Group III nitride semiconductor layer with low resistance and excellent flatness, in order to obtain a Group III nitride semiconductor light emitting device exhibiting low forward voltage and excellent light emitting efficiency.

9 Claims, 3 Drawing Sheets

US 7,456,445 B2

GROUP III NITRIDE SEMICONDUCTOR LIGHT EMITTING DEVICE

CROSS-REFERENCES TO RELATED APPLICATIONS

This application claims benefit under 35 U.S.C. section 119(e) to U.S. Provisional Application Ser. No. 60/576,031 filed Jun. 2, 2004.

TECHNICAL FIELD

The present invention relates to a Group III nitride semiconductor light emitting device utilizing a low-resistance n-type Group III nitride semiconductor layer provided with a region variably doped with germanium (Ge).

BACKGROUND ART

Group III nitride semiconductors are utilized as functional materials for constructing Group III nitride semiconductor light emitting devices having a pn junction type configuration such as light emitting diodes (LEDs) or laser diodes (LD), which emit short-wavelength visible light (for example, see Japanese Unexamined Patent Publication No. 2000-332364). For example, when constructing an LED which displays emitted light in the near ultraviolet band, the blue band or the green band, n-type or p-type aluminum gallium nitride (compositional formula $Al_xGa_yN$: $0 \leq x$, $y \leq 1$, $x+y=1$) is utilized to construct the clad layer (for example, see Japanese Unexamined Patent Publication No. 2003-229645). Also, gallium indium nitride (compositional formula: $Ga_yIn_zN$: $0 \leq y$, $z \leq 1$, $y+z=1$) is utilized for producing active layers (light emitting layers) (for example, Japanese Examined Patent Publication SHO No. 55-3834).

For conventional Group III nitride semiconductor light emitting devices, it is common to bond an n-type or p-type Group III nitride semiconductor layer to the light emitting layer. This creates a light emitting section with a hetero junction structure for high-intensity light emission. For example, in order to construct a light emitting section with a double hetero (DH) junction structure, the light emitting layer is conventionally composed of $Ga_yIn_zN$ ($0 \leq y$, $z \leq 1$, $y+z=1$), and an n-type or p-type Group III nitride semiconductor layer is bonded as the clad layer (for example, see I. Akazaki, "Group III-V Compound Semiconductors", May 20, 1995, Baifukan Publishing, Ch. 13.).

An n-type Group III nitride semiconductor layer situated between a substrate and a light emitting layer, for example, is conventionally constructed entirely of a Group III nitride semiconductor containing added silicon (Si). For example, an n-type $Al_xGa_yN$ ($0 \leq x$, $y \leq 1$, $x+y=1$) layer is utilized which has its resistivity controlled by adjustment of the silicon doping content (for example, see Japanese Patent No. 3383242).

However, when silicon (Si) is doped in a large amount in an attempt to accomplish vapor phase growth of a low-resistance n-type Group III nitride semiconductor layer, cracking has been a common problem (for example, see H. Murakami et al., J. Crystal Growth, 115(1991), 648). Specifically, in the conventional techniques for silicon doping, it has not been possible to stably obtain an n-type Group III nitride semiconductor layer with low resistance and in a continuous manner.

On the other hand, Ge is known as an n-type impurity alternative to silicon (Si) (for example, see Japanese Unexamined Patent Publication No. 4-170397). However, it has low doping efficiency compared to Si (see Jpn. J. Appl. Phys., 31(9A) (1992), 2883), and is unsuitable for obtaining low resistance n-type Group III nitride semiconductor layers. In addition, high-concentration doping of Ge has been problematic due to generation of pits in the surface of the n-type Group III nitride semiconductor layer, which impair its flatness (see Group III Nitride Semiconductor Compounds (CLARENDON Press (OXFORD) 1998), p. 104.).

DISCLOSURE OF INVENTION

It is an object of the invention to employ a Ge-doped n-type Group III nitride semiconductor layer with low resistance and excellent flatness, in order to obtain a Group III nitride semiconductor light emitting device exhibiting low forward voltage and excellent light emitting efficiency.

The gist of the present invention is a Group III nitride semiconductor light emitting device having a light emitting layer bonded to a crystal layer composed of an n-type or p-type Group III nitride semiconductor, the Group III nitride semiconductor light emitting device being characterized by comprising an n-type Group III nitride semiconductor layer having Ge added thereto and having a resistivity of $1 \times 10^{-1}$ to $1 \times 10^{-3}$ Ωcm.

According to a preferred embodiment of the invention, the n-type Group III nitride semiconductor has the compositional formula $Al_xGa_yIn_zN_{1-a}M_a$ (wherein $0 \leq x \leq 1$, $0 \leq y \leq 1$, $0 \leq z \leq 1$, $x+y+z=1$, M represents a Group V element other than nitrogen (N) and $0 \leq a < 1$). According to another preferred embodiment of the invention, the Ge-added n-type nitride semiconductor layer is a Group III nitride semiconductor layer including a region in which the Ge atom concentration varies in a periodic manner. According to yet another preferred embodiment of the invention, the region in which the Ge atom concentration varies in a periodic manner is composed of a structure with periodic alternating lamination of the Ge-added Group III nitride semiconductor layer and an undoped Group III nitride semiconductor layer. According to still another preferred embodiment of the invention, the layer thickness of the Ge-added Group III nitride semiconductor layer is equal to or less than the layer thickness of the undoped Group III nitride semiconductor layer. According to yet another preferred embodiment of the invention, the Ge atom concentration in the Ge-added Group III nitride semiconductor layer is at least $1 \times 10^{17}$ cm$^{-3}$ and no greater than $1 \times 10^{20}$ cm$^{-3}$. According to yet another preferred embodiment of the invention, the n-type Group III nitride semiconductor layer is situated between a substrate and the light emitting layer.

Specifically, the present invention relates to the following.

(1) A Group III nitride semiconductor light emitting device having a light emitting layer bonded to a crystal layer composed of an n-type or p-type Group III nitride semiconductor, the Group III nitride semiconductor light emitting device being characterized by comprising an n-type Group III nitride semiconductor layer having germanium (Ge) added thereto and having a resistivity of $1 \times 10^{-1}$ to $1 \times 10^{-3}$ Ωcm.

(2) A Group III nitride semiconductor light emitting device according to (1) above, wherein the n-type Group III nitride semiconductor has the compositional formula $Al_xGa_yIn_zN_{1-a}M_a$ (wherein $0 \leq x \leq 1$, $0 \leq y \leq 1$, $0 \leq z \leq 1$, $x+y+z=1$, M represents a Group V element other than nitrogen (N) and $0 \leq a \leq 1$).

(3) A Group III nitride semiconductor light emitting device according to (1) or (2) above, wherein the Ge-added n-type nitride semiconductor layer is a Group III nitride semiconductor layer including a region in which the Ge atom concentration varies in a periodic manner.

(4) A Group III nitride semiconductor light emitting device according to any one of (1) to (3) above, wherein the region in which the Ge atom concentration varies in a periodic manner is composed of a structure with periodic alternating lamination of the Ge-added Group III nitride semiconductor layer and an undoped Group III nitride semiconductor layer.

(5) A Group III nitride semiconductor light emitting device according to any one of (1) to (4) above, wherein the layer thickness of the Ge-added Group III nitride semiconductor layer is equal to or less than the layer thickness of the undoped Group III nitride semiconductor layer.

(6) A Group III nitride semiconductor light emitting device according to any one of (1) to (5) above, wherein the Ge atom concentration in the Ge-added Group III nitride semiconductor layer is at least $1\times10^{17}$ cm$^{-3}$ and no greater than $1\times10^{20}$ cm$^{-3}$.

(7) A Group III nitride semiconductor light emitting device according to any one of (1) to (6) above, wherein the n-type Group III nitride semiconductor layer is situated between the substrate and the light emitting layer.

(8) A Group III nitride semiconductor light emitting device according to any one of (3) to (7) above, wherein the total layer thickness in the region in which the Ge atom concentration varies in a periodic manner is at least 0.1 μm and no greater than 10 μm.

(9) A Group III nitride semiconductor light emitting device according to any one of (3) to (8) above, wherein the layer thickness of one period in the region in which the Ge atom concentration varies in a periodic manner is at least 1 nm and no greater than 1000 nm.

(10) A process for fabrication of a Group III nitride semiconductor light emitting device having a light emitting layer bonded to a crystal layer composed of an n-type or p-type Group III nitride semiconductor, the process being characterized in that during growth of the Ge-added n-type Group III nitride semiconductor layer, Ge atom is supplied to the reaction system in a periodically varying manner.

(11) An LED employing a Group III nitride semiconductor light emitting device according to any one of (1) to (9) above.

(12) A lamp employing a light emitting device according to (11).

The light emitting device of the invention employing a Ge-doped n-type Group III nitride semiconductor layer as described above has a low forward voltage and excellent light emitting efficiency.

Figure 1:
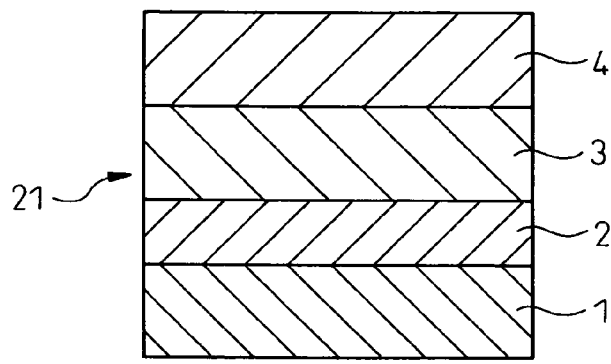
FIG. 1 is a schematic view of the cross-sectional construction of an epitaxial laminated structure 21.

1 Substrate
2 AlN thin-film layer
3 Undoped GaN layer
4 Ge-doped GaN layer
6 Multiple quantum well structure light emitting layer
7 p-type AlGaN clad layer
8 p-type GaN contact layer
9 n-type home electrode
10 p-type ohmic electrode

BEST MODE FOR CARRYING OUT THE INVENTION

The n-type Group III nitride semiconductor layer comprising a region in which the Ge atom concentration varies in a periodic manner according to the invention is formed on a substrate composed of an oxide single crystal material such as sapphire (α-Al$_2$O$_3$ single crystal), zinc oxide (ZnO) or lithium gallium oxide (compositional formula: LiGaO$_2$), or a Group IV semiconductor single crystal such as silicon (Si) single crystal or cubic or hexagonal crystalline silicon carbide (SiC), which are materials having a relatively high melting point and high heat resistance. Group III-V compound semiconductor single crystal materials such as gallium phosphate (GaP) may also be utilized for the substrate material. An optically transparent single crystal material capable of transmitting light emitted from the light emitting layer may be effectively utilized as the substrate. Sapphire is preferred.

The n-type Group III nitride semiconductor layer comprising the Ge-added (doped) region preferably has the compositional ratio Al$_x$Ga$_y$In$_z$N$_{1-a}$M$_a$ (wherein $0 \leq x \leq 1$, $0 \leq y \leq 1$, $0 \leq z \leq 1$, $x+y+z =1$, M represents a Group V element other than nitrogen (N) and $0 \leq a < 1$). M in the compositional formula may represent P, As, Sb or the like.

When a lattice mismatch occurs between the crystal substrate and the Group III nitride semiconductor layer formed thereover, the mismatch can be alleviated to produce an upper layer with excellent crystallinity by providing an intervening low temperature buffer layer or high temperature buffer layer. The buffer layer may be composed of, for example, aluminum gallium nitride (Al$_x$Ga$_y$In$_z$N: $0 \leq x$, y, $z \leq 1$ and $x+y+z=1$).

The n-type Group III nitride semiconductor layer comprising a region in which the Ge atom concentration varies in a periodic manner according to the invention may be formed by a vapor phase growth method such as metal organic chemical vapor deposition (abbreviated as MOCVD, MOVPE or OMVPE), molecular beam epitaxial growth (MBE), halogen vapor phase growth, hydride vapor phase growth or the like. MOCVD is preferred among these methods.

In MOCVD, hydrogen (H$_2$) or nitrogen (N$_2$) is used as the carrier gas, and for Group III materials, trimethylgallium (TMG) or triethylgallium (TEG) is used as a Ga source, trimethylaluminum (TMA) or triethylaluminum (TEA) is used as an Al source and trimethylindium (TMI) or triethylindium (TEI) is used as an In source, and ammonia (NH$_3$) or hydrazine (N$_2$H$_4$) is used as a nitrogen source.

As the Ge doping source there may be used germanium gas (GeH$_4$) or an organic Ge compound such as tetramethylgermanium (molecular formula: (CH$_3$)$_4$Ge) or tetraethylgermanium ((C$_2$H$_5$)$_4$Ge). For MBE, elemental Ge may also be utilized as the doping source.

In MOCVD, the n-type Group III nitride semiconductor layer comprising a region in which the Ge atom concentration varies in a periodic manner is preferably formed on a sapphire substrate using (CH$_3$)$_4$Ge at a temperature of between 900° C. and 1250° C.

A suitable resistivity for the n-type Group III nitride semiconductor layer comprising a region in which the Ge atom concentration varies in a periodic manner is $1\times10^{-1}$ to $1\times10^{-3}$ Ωcm. It is preferably $1\times10^{-2}$ to $3\times10^{-1}$ Ωcm, and more preferably $3\times10^{-2}$ to $5\times10^{-3}$ Ωcm. The resistivity is preferably not greater than $1\times10^{-1}$ Ωcm because the increased resistance will require an increase in the forward voltage of the device. It is also preferably not less than $1\times10^{-3}$ Ωcm because this may result in production of pits which impair the flatness.

The resistivity of the n-type Group III nitride semiconductor layer comprising a region in which the Ge atom concentration varies in a periodic manner may be set to a value in a prescribed range by varying the mixing proportion of the Ge doping atom and the other starting material gas during the gas phase growth process. Alternatively, a value within a prescribed range may be set by adjusting not the mixing proportion but rather the growth temperature, growth pressure or period film thickness.

The region in which the Ge atom concentration varies in a periodic manner is formed by periodically varying with time the supply of the Ge doping source to the vapor phase growth reaction system during vapor phase growth of the Group III nitride semiconductor layer. For example, after first forming an undoped thin-layer without supplying the Ge doping source to the vapor phase growth region, the Ge doping source is instantaneously supplied in a large amount to the vapor phase growth region to form a thin-layer comprising a high concentration of Ge atom. By increasing or decreasing the amount of Ge doping source supplied to the vapor phase growth reaction system, it is possible to form a region in which the Ge atom concentration varies in a periodic manner. Alternatively, it may be formed by first growing a thin-layer with a low Ge atom concentration, and then interrupting the growth until the growth conditions such as the V/III proportion are adjusted for addition of Ge atoms at a high concentration, to bond thereto a thin-layer comprising a high concentration of Ge atoms.

For periodic alternating lamination of an n-type Group III nitride semiconductor thin-layer containing a high concentration of Ge atoms and an n-type Group III nitride semiconductor thin-layer containing a low concentration of Ge atoms to form a region in which the Ge atom concentration varies in a periodic manner, the total layer thickness in the region in which the Ge atom concentration varies in a periodic manner may be at least 0.1 µm and no greater than 10 µm. It is preferably at least 0.3 µm and no greater than 5 µm, and even more preferably at least 0.5 µm and no greater than 3 µm. If the layer thickness is less than 0.1 µm it may be difficult to obtain an n-type Group III nitride semiconductor layer with low resistance. The resulting effect will not be enhanced with a thickness of greater than 10 µm.

The total of the layer thickness of the n-type Group III nitride semiconductor layer containing a high Ge concentration and the layer thickness of the n-type Group III nitride semiconductor layer containing a low Ge concentration, i.e. the periodic layer thickness, is suitably at least 1 nm and no greater than 1000 nm. It is preferably at least 4 nm and no greater than 400 nm and even more preferably at least 6 nm and no greater than 100 nm. If the total layer thickness is less than 1 nm, it will be difficult to achieve an effect of periodic lamination of the Ge-doped layer. If it exceeds 1000 nm, it may be impossible to prevent pit formation or the resistance may be increased.

Specifically, when the high concentration Ge-doped layer is thicker than the low concentration Ge-doped layer during one period, it will be impossible to prevent pit formation and difficult to achieve flatness. On the other hand, satisfactory flatness can be achieved if the low concentration Ge-doped layer is of equivalent or greater thickness than the high concentration Ge-doped layer during one period. Thus, the thickness of the low concentration Ge-doped layer is preferably equal to or greater than the thickness of the Ge-doped thin-layer. Constructing it of an undoped n-type Group III nitride semiconductor thin-layer in order to further reduce the Ge atom concentration is effective to increase the effect of filling in the pits present on the surface of the n-type Group III nitride semiconductor thin-layer comprising a high Ge atom concentration, in order to obtain a surface-flat Ge-doped Group III nitride semiconductor thin-layer.

However, if the low concentration layer is too thick, the resistance will be increased and it will be difficult to obtain a satisfactory n-type Group III nitride semiconductor layer. Specifically, a large low concentration layer is disadvantageous for obtaining a Group III nitride semiconductor light emitting device having a low forward voltage (Vf) or threshold voltage (Vth). Thus, the thickness of the n-type Group III nitride semiconductor thin-layer with the low Ge atom concentration should appropriately be no greater than 500 nm. The low concentration layer preferably has a lower Ge concentration and a lower carrier concentration since this will give a smaller thickness.

The laminating periodicity is appropriately at least 1 and no greater than 10,000. It is preferably at least 10 and no greater than 1000, and even more preferably at least 20 and no greater than 200. For example, one period may be established as a single combination of a high concentration Ge-doped GaN thin-layer with a thickness of 10 nm and a low concentration Ge-doped GaN layer with a thickness of 10 nm, and lamination performed across 100 periods to form a region in which the Ge atom concentration varies in a periodic manner, having a total thickness of 2 µm.

The layer thickness of the n-type Group III nitride semiconductor layer comprising a high concentration of Ge is suitably at least 0.5 nm and no greater than 500 nm. It is preferably at least 2 nm and no greater than 200nm, and more preferably at least 3 nm and no greater than 50 nm. If the layer thickness is less than 0.5 nm Ge doping will be insufficient, tending to result in high resistance. At greater than 500 nm, pits in the low concentration layer may not be filled in or the resistance may be increased when the low concentration layer thickness is increased to fill in the pits.

The layer thickness of the n-type Group III nitride semiconductor layer comprising a low Ge concentration is suitably at least 0.5 nm and no greater than 500 nm. It is preferably at least 2 nm and no greater than 200 nm, and more preferably at least 3 nm and no greater than 50 nm. If the layer thickness is less than 0.5 nm the pits formed in the Ge doped layer will not be sufficiently filled in, possibly impairing the flatness. It is therefore preferably thicker than the n-type Group III nitride semiconductor layer comprising a high Ge concentration. However, the thickness is preferably not greater than 500 nm because the resistance will be increased.

The Ge atom concentration inside the n-type Group III nitride semiconductor layer comprising a high Ge concentration is appropriately at least $5 \times 10^{17}$ cm$^{-3}$ and no greater than $1 \times 10^{20}$ cm$^{-3}$. It is preferably $1 \times 10^{18}$ cm$^{-3}$ and no greater than $3 \times 10^{19}$ cm$^{-3}$ and more preferably $3 \times 10^{18}$ cm$^{-3}$ and no greater than $2 \times 10^{19}$ cm$^{-3}$. The Ge atom concentration inside the n-type Group III nitride semiconductor layer comprising a high Ge concentration does not necessarily have to be constant, as it may vary either continuously or discontinuously.

The Ge atom concentration-inside the n-type Group III nitride semiconductor layer comprising a low Ge concentration is a lower concentration than the Ge atom concentration inside the n-type Group III nitride semiconductor layer comprising a high Ge concentration, and it is suitably at least the minimum limit of determination (according to the analysis method described below) and no greater than $2 \times 10^{19}$ cm$^{-3}$. It is preferably at least the minimum limit of determination and no greater than $1 \times 10^{19}$ cm$^{-3}$, and more preferably at least the minimum limit of determination and no greater than $5 \times 10^{18}$ cm$^{-3}$, and is most preferably undoped. The Ge atom concentration inside the n-type Group III nitride semiconductor layer comprising a low Ge concentration does not necessarily have to be constant, as it may vary either continuously or discontinuously. The Ge atom concentration preferably does not exceed $2\times10^{19}$ cm$^{-3}$, because the pit density on the surface will increase drastically.

The Ge atom concentration may be measured by, for example, secondary ion mass spectrometry (SIMS). This method accomplishes mass spectrometry of ionized released elements based on irradiation of primary ions on a sample surface, and allows observation and quantitation of the concentration distribution in the depthwise direction of a specific element. This method is also effective for the Ge element in the Group III nitride semiconductor layer.

If the high concentration Ge-doped layer concentration is at least $5\times10^{17}$ cm$^{-3}$, it will be suitable for construction of an LED with a low forward voltage. On the other hand, if it is $1\times10^{20}$ cm$^{-3}$ the carrier concentration of the entire region in which the Ge atom concentration varies in a periodic manner will be approximately $(3\text{-}4)\times10^{19}$ cm$^{-3}$. Ge is preferably not doped beyond this atom concentration, because the density of pits on the surface will increase drastically.

The region in which the Ge atom concentration varies in a periodic manner may be situated anywhere within the n-type Group III nitride semiconductor layer. For example, it may be directly bonded to the surface of the crystal substrate. It may also be bonded on a buffer layer provided on the surface of the crystal substrate. An n-type Group III nitride semiconductor layer with excellent crystallinity can be obtained by providing the region in which the Ge atom concentration varies in a periodic manner below the n-type Group III nitride semiconductor layer in close contact with the crystal substrate or buffer layer. This is because providing a region in which the Ge atom concentration varies in a periodic manner inhibits propagation toward the upper end of the layer, such as misfit dislocation based on lattice mismatch with the crystal substrate. In this case, the periodic layer thickness may be between 0.5 μm and 5 μm.

In the region in which the Ge atom concentration varies in a periodic manner, propagation of dislocation from the lower end to the upper layer can be inhibited. Consequently, a mode wherein the region in which the Ge atom concentration varies in a periodic manner is provided over the n-type Group III nitride semiconductor layer as an underlayer for formation of the light emitting layer, is effective for forming a light emitting layer with excellent crystallinity. It is therefore suitable for obtaining a Group III nitride semiconductor light emitting device with high light emitting intensity.

The light emitting layer preferably has a quantum well structure, and more preferably a multiple quantum well structure.

The p-type layer usually has a thickness of 0.01-1 μm and comprises a p-contact layer for formation of a positive electrode with the p-clad layer contacting with the light emitting layer. The p-clad layer and p-contact layer may be the same layer. The p-clad layer is formed using GaN, AlGaN or the like, and Mg is doped as the p-dopant. In order to facilitate contact with the electrodes it is preferred to form the top surface layer as a layer with a high carrier concentration, but most of the layer may even have high resistance. In other words, there is no problem with reducing the amount of dopant, and there may also be included hydrogen which is considered to inhibit activation of the dopant. In fact, this is preferred because it will improve the reverse withstanding pressure of the element.

For the p-clad layer as well, layers with different compositions or lattice constants may be formed as alternating multiple laminated layers. The dopant amounts and film thicknesses, as well as the compositions, may also be varied depending on the laminated layer.

The p-contact layer may be formed using GaN, AlGaN, InGaN or the like, with Mg doped as an impurity. A Mg-doped Group III nitride semiconductor ordinarily has high resistance when removed from the reaction furnace, and while it has been reported to exhibit p-conductivity when subjected to activation treatment by annealing, electron beam irradiation, microwave irradiation or the like, it may be utilized without activation treatment as explained above.

Boron phosphide doped with a p-type impurity may also be used as the p-contact layer. Boron phosphide doped with a p-type impurity exhibits p-conductivity even without any p-type treatment.

There are no particular restrictions on the method of growing the Group III nitride semiconductor of the underlying layer, light emitting layer and p-type layer, and a known method such as MBE, MOCVD, HVPE or the like may be employed in the same manner under known conditions as for the n-type layer. MOCVD is preferred.

The negative electrode may have any of various known compositions and structures, and such known negative electrodes may be used without any restrictions. The contact material for the negative electrode in contact with the n-contact layer may be, in addition to Al, Ti, Ni or Au, also Cr, W, V or the like. A bonding property may of course be conferred by forming a multilayer structure for the negative electrode as a whole. In particular, the upper surface layer is preferably coated with Au in order to facilitate bonding.

The positive electrode may also have any of various known compositions and structures, and such known positive electrodes may be used without any restrictions.

The transparent positive electrode material may include Pt, Pd, Au, Cr, Ni, Co or the like. It is known that the transparency is enhanced if a portion thereof has an oxide structure. As reflective positive electrode materials there may be used, in addition to the materials mentioned above, Rh, Ag or Al.

These positive electrodes may be formed by methods such as sputtering or vacuum vapor deposition. Particularly when sputtering is employed, the sputtering conditions may be appropriately controlled to obtain ohmic contact without annealing after formation of the electrode film.

The structure of the light emitting device may be as a flip-chip element comprising a reflective positive electrode, or as a face-up element provided with a translucent positive electrode or a lattice-type or comb-shaped positive electrode.

EXAMPLES

Example 1

A Ge-doped layer according to the invention formed on a sapphire substrate will now be explained.

FIG. 1 shows a schematic view of the cross-sectional construction of the epitaxial laminated structure 21 described in the examples.

The epitaxial laminated structure is formed by the following procedure, using ordinary reduced pressure MOCVD. First, a (0001)-sapphire substrate 1 was placed on a semiconductor-grade high-purity graphite susceptor, heated to a film-forming temperature using a radio frequency (RF) induction heater system. After placement, nitrogen gas was circulated into a stainless steel vapor phase growth reaction furnace for purging of the furnace.

After circulating the nitrogen gas through the vapor phase growth reaction furnace for 8 minutes, the induction heater system was activated to increase the temperature of the substrate 1 from-room temperature to 600° C. over a period of 10 minutes. Hydrogen gas and nitrogen gas were then circulated while keeping the temperature of the substrate 1 at 600° C., and the pressure in the vapor phase growth reaction furnace at $1.5 \times 10^4$ Pascals (Pa). It was then allowed to stand at this temperature and pressure for 2 minutes for thermal cleaning of the surface of the substrate 1. After completion of the thermal cleaning, supply of the nitrogen gas into the vapor phase growth reaction furnace was interrupted. The hydrogen gas was supplied intermittently.

The temperature of the substrate 1 was then increased to 1120° C. in the hydrogen atmosphere. Upon confirming a stable temperature at 1120° C, hydrogen gas with trimethylaluminum (TMAl) vapor was supplied into the vapor phase growth reaction furnace for a period of 8 minutes and 30 seconds. This caused reaction with the nitrogen (N) atoms produced by decomposition of the nitrogen (N)-containing accumulated precipitate which had already adhered to the inner wall of the vapor phase growth reaction furnace, resulting in adhesion of an aluminum nitride (AlN) thin-film 2 with a thickness of several nanometers on the sapphire substrate 1. Supply of the hydrogen gas with TMAl vapor into the vapor phase growth reaction furnace was interrupted to complete growth of the AlN thin-film, and then a period of 4 minutes was allowed for complete discharge of the TMAl remaining in the vapor phase growth furnace.

Next, ammonia ($NH_3$) gas was supplied to the vapor phase growth reaction furnace, and after 4 minutes the temperature of the susceptor was increased to 1040° C. while continuing circulation of the ammonia gas. Upon confirming a susceptor temperature of 1040° C., and allowing time for temporary stabilization of the temperature, supply of trimethylgallium (TMGa) into the vapor phase growth reaction furnace was initiated for growth of an undoped GaN layer 3 for a period of one hour. The thickness of the undoped GaN layer 3 was 2 μm.

The wafer temperature was then increased to 1120° C., and upon stabilization of the temperature, tetramethylgermanium $((CH_3)_4Ge)$ was circulated for 18 seconds and circulation was interrupted for another 18 seconds. This cycle was repeated 100 times to form a 2.0 μm Ge-doped GaN layer 4 with a periodically varying Ge concentration.

When growth of the Ge-doped GaN layer 4 was completed, current supply to the induction heater system was cut off and the substrate 1 temperature was allowed to fall to room temperature over a period of about 20 minutes. The atmosphere in the vapor phase growth reaction furnace during this time consisted entirely of nitrogen. Once reduction of the substrate 1 temperature to room temperature was confirmed, the laminated structure was removed out of the vapor phase growth reaction furnace.

As a result, a Ge-doped GaN layer having a carrier concentration of $7 \times 10^{18}$ cm$^{-3}$ according to Hall measurement was obtained as a flat N-type GaN layer with a pit density of no greater than 200/cm². The resistivity of the Ge-doped GaN layer was $8 \times 10^{-3}$ Ωcm. SIMS analysis revealed that the Ge concentration of the high concentration Ge-doped layer was $1.2 \times 10^{19}$ cm$^{-3}$ and the Ge concentration of the low concentration Ge-doped layer was $1 \times 10^{18}$ cm$^{-3}$. The periodic layer thickness was 20 nm.

Example 2

A Ge-doped GaN layer was formed under the same conditions as Example 1, except that a cycle comprising 18 seconds of tetramethylgermanium $((CH_3)_4Ge)$ circulation followed by 18 seconds of interruption was repeated 100 times, to form a 2.0 μm Ge-doped GaN layer 4 with a periodically varying Ge concentration.

As a result, the carrier concentration was $2 \times 10^{19}$ cm$^{-3}$ according to Hall measurement and the pit density was no greater than 40/cm². The resistivity of the Ge-doped GaN layer was $2.5 \times 10^{-3}$ Ωcm. SIMS analysis revealed that the Ge concentration of the high concentration Ge-doped layer was $4 \times 10^{19}$ cm$^{-3}$ and the Ge concentration of the low concentration Ge-doped layer was $3 \times 10^{18}$ cm$^{-3}$. The periodic layer thickness was 20 nm.

By controlling the Ge-containing gas supply volume (units: mol/min) as in Examples 1 and 2 above, it is possible to create a variation in resistivity of the Ge-doped GaN layer. In this example the supply of Ge-containing starting gas was controlled, but the supply of starting gas may also be controlled, or the mixing ratio of both may be controlled to vary the resistivity. Also, the conditions (for example, temperature or pressure) for varying the efficiency of uptake of the dopant material into the crystals may be changed to control the resistivity.

Control of the average resistivity of the contact layer as a whole can also be achieved by controlling the thicknesses of the high-concentration doped layer and the low-concentration doped layer.

Example 3

The present invention will now be explained in greater detail by an example wherein a light emitting layer is laminated on the Ge-doped GaN layer of Example 1 to construct a Group III nitride semiconductor light emitting diode.

Figure 2:
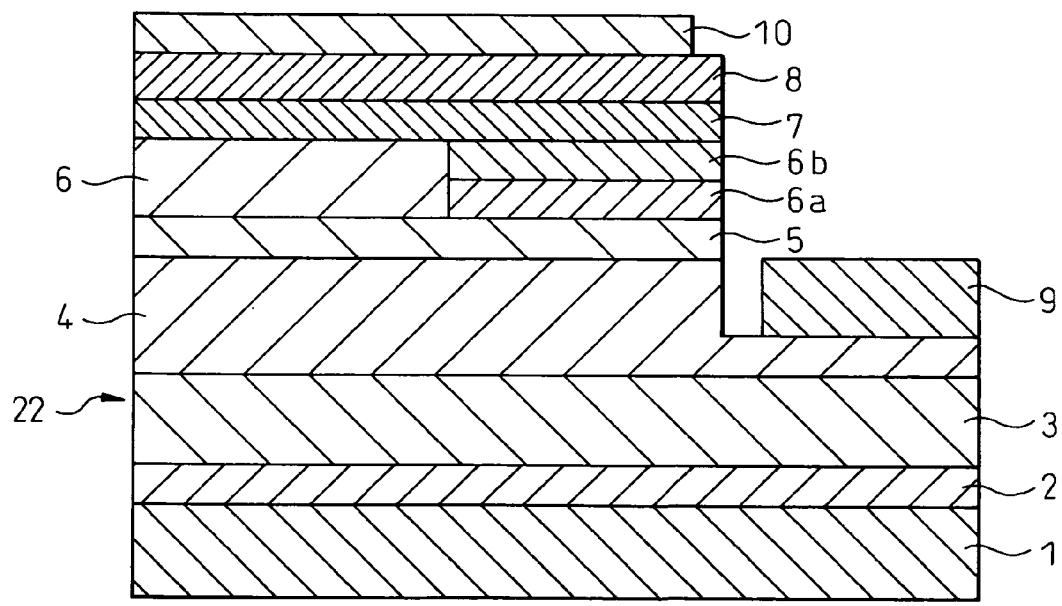
FIG. 2 is a schematic view of the cross-sectional construction of an epitaxial laminated structure 22.

FIG. 2 shows a schematic view of the cross-sectional structure of an epitaxial laminated structure 22 for fabrication of the LED described in this example.

After laminating the Ge-doped GaN layer in the same manner as Example 1, an undoped n-type $Al_{0.07}Ga_{0.93}N$ clad layer 5 was accumulated at 1060° C. The thickness of the clad layer 5 was 12.5 nm.

Next, a multiple quantum well structure having a 5-period structure comprising a barrier layer 6a composed of $Al_{0.03}Ga_{0.97}N$ and a well layer composed of $In_{0.25}Ga_{0.75}N$ was provided on the undoped n-type $Al_{0.07}Ga_{0.93}N$ clad layer 5, with the substrate 1 temperature at 730° C. For the light emitting layer 6 of the multiple quantum well structure, first an $Al_{0.03}Ga_{0.097}N$ barrier layer 6a was formed by bonding to the undoped n-type $Al_{0.07}Ga_{0.93}N$ clad layer 5.

The $Al_{0.03}Ga_{0.097}N$ barrier layer 6a was grown using trimethylaluminum (TMAl) as the aluminum source and triethylgallium (TEGa) as the gallium source. The layer thickness was 8 nm, and the layer was undoped.

An $In_{0.25}Ga_{0.75}N$ well layer 6b was grown using triethylgallium (TEGa) as the gallium source and trimethylindium (TMIn) as the indium source. The layer thickness was 2.5 nm, and the layer was undoped.

A magnesium (Mg)-doped p-type $Al_{0.07}Ga_{0.93}N$ clad layer 7 was formed on the light emitting layer 6 composed of the multiple quantum well structure. The layer thickness was 10 nm. A Mg-doped p-type GaN contact layer 8 was further formed on the p-type $Al_{0.07}Ga_{0.93}N$ clad layer 7. The Mg doping source used was bis-cyclopentadienyl Mg (bis-$Cp_2Mg$). The Mg was added in an amount for a positive hole concentration of $8 \times 10^{17}$ cm$^{-3}$ in the p-type GaN contact layer 8. The thickness of the p-type GaN contact layer 8 was 100 nm.

After completing growth of the p-type GaN contact layer 8, current supply to the induction heater system was cut off and the substrate 1 temperature was allowed to fall to room temperature over a period of about 20 minutes. The atmosphere in the vapor phase growth reaction furnace during this time consisted entirely of nitrogen. Once reduction of the substrate 1 temperature to room temperature was confirmed, the laminated structure 22 was removed out of the vapor phase growth reaction furnace. At this point, the p-type GaN contact layer 8 already exhibited p-type conductivity without annealing treatment for electrical activation of the p-type carrier (Mg).

Next, a publicly known photolithography technique and an ordinary dry etching technique were used to expose the surface of the high Ge-doped GaN layer 4 within the prescribed regions in which the n-type ohmic electrode 9 was to be formed. The n-type ohmic electrode 9 was formed by laminating titanium (Ti) and gold (Au) on the surface side of the exposed Ge-doped n-type GaN layer 4. Ordinary vacuum vapor deposition means and publicly known photolithography means were then utilized to form a p-type ohmic electrode 10 by laminating nickel (Ni) and gold (Au) in that order from the surface side, over the entire surface of the p-type GaN contact layer 8 constituting the surface of the remaining laminated structure 22.

This structure was then cut into a 350 μm square LED chip (not shown) by plan view, and the chip was placed onto a lead frame (not shown) and a gold lead (not shown) was wire bound to the lead frame to allow a device driving circuit to flow from the lead frame to the LED chip (not shown).

A device driving circuit was then conducted in the forward direction between the n-type and p-type ohmic electrodes 9, 10 via the lead frame. The forward voltage for a forward current of 20 mA was 3.5 V. The center wavelength of the blue band light emitted during conduction of the 20 mA forward current was 460 nm. The intensity of emission reached. 5 mW as measured using an ordinary integrating sphere, thus indicating that a Group III nitride semiconductor LED with high intensity emulsion had been obtained.

Example 4

A Group III nitride semiconductor light emitting device was fabricated in the same manner as Example 3, except that the laminated structure produced in Example 2 was used. The forward voltage and emission intensity were measured in the same manner as Example 3 as 3.5 V and 4.8 mW, respectively. Also, the center wavelength of blue band emission was 455 nm.

Comparative Example 1

Figure 3:
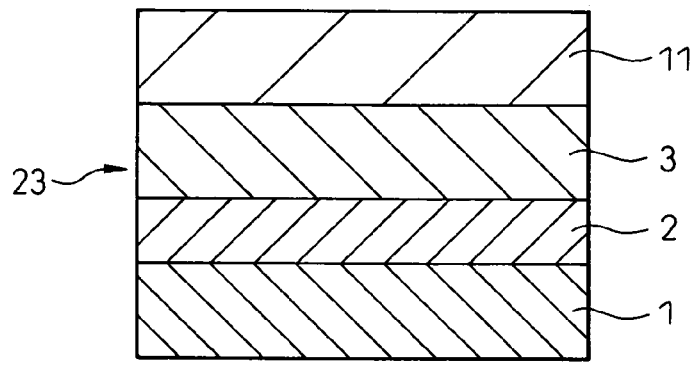
FIG. 3 is a schematic view of the cross-sectional construction of an epitaxial laminated structure 23.

FIG. 3 schematically shows the cross-sectional structure of an epitaxial laminated structure 23 formed with the same structure as in Example 1, except that instead of alternately laminating a $(CH_3)_4Ge$-conducting and non-conducting layer as in Example 1, a continuously $(CH_3)_4Ge$-conducting Ge-doped N-type GaN layer 11 was formed to 2.0 μm.

As a result, when combined with a carrier concentration of $1\times10^{19}$ cm$^{-3}$, a very high pit density of $1\times10^6$ cm$^{-3}$ was produced, and therefore a flat surface was not obtained.

Comparative Example 2

Figure 4:
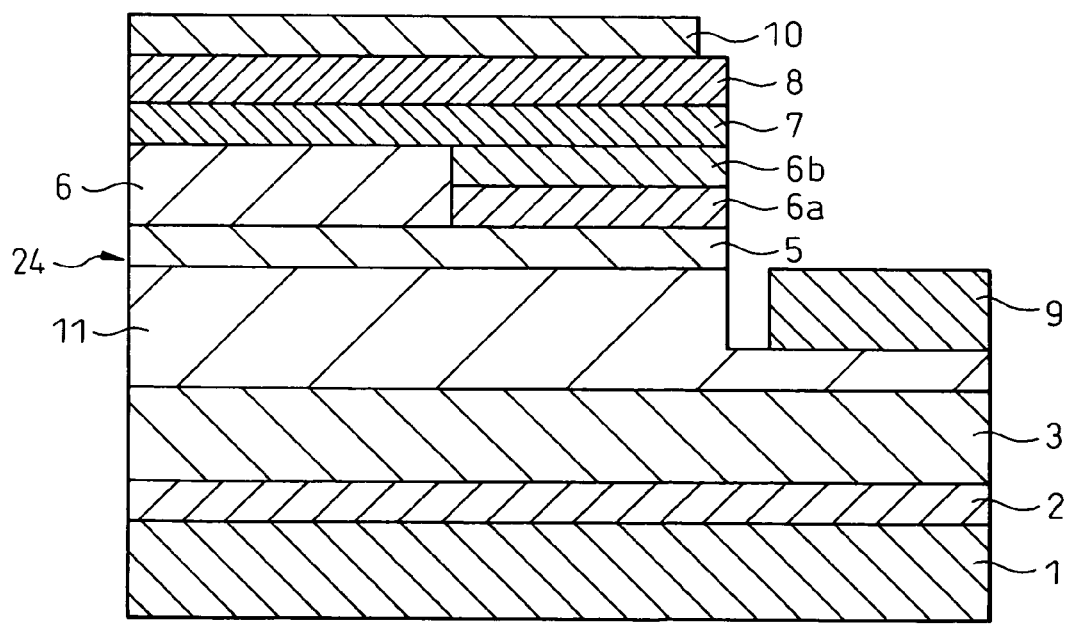
FIG. 4 shows an epitaxial laminated structure 24 for fabrication of an LED.

Using the structure of Example 3, tetramethylgermanium $((CH_3)_4Ge)$ was circulated for 18 seconds and circulation was interrupted for another 18 seconds. Instead of repeating this cycle 100 times to form a 2.0 μm Ge-doped GaN layer 4 with a periodically varying Ge concentration, a Ge-doped N-type GaN layer 11 was formed to 2.0 μm by continuous circulation of $(CH_3)_4Ge$ in the same manner as Comparative Example 1. Next, an n-type clad layer 5, a multiple quantum well structure light emitting layer 6, a p-type $Al_{0.07}Ga_{0.93}N$ clad layer 7 and a p-type GaN contact layer 8 were formed in the same manner as Example 3, an electrode was formed under the same conditions as Example 3 and placed on a lead frame, and wire bonding was accomplished to fabricate an LED (FIG. 4: epitaxial laminated structure 24 for fabrication of LED). As a result, only a low intensity light emission of 0.4 mW, measured using an ordinary integrating sphere, was obtained as the characteristic during conduction of a forward current of 20 mA.

Comparative Example 3

Figure 5:
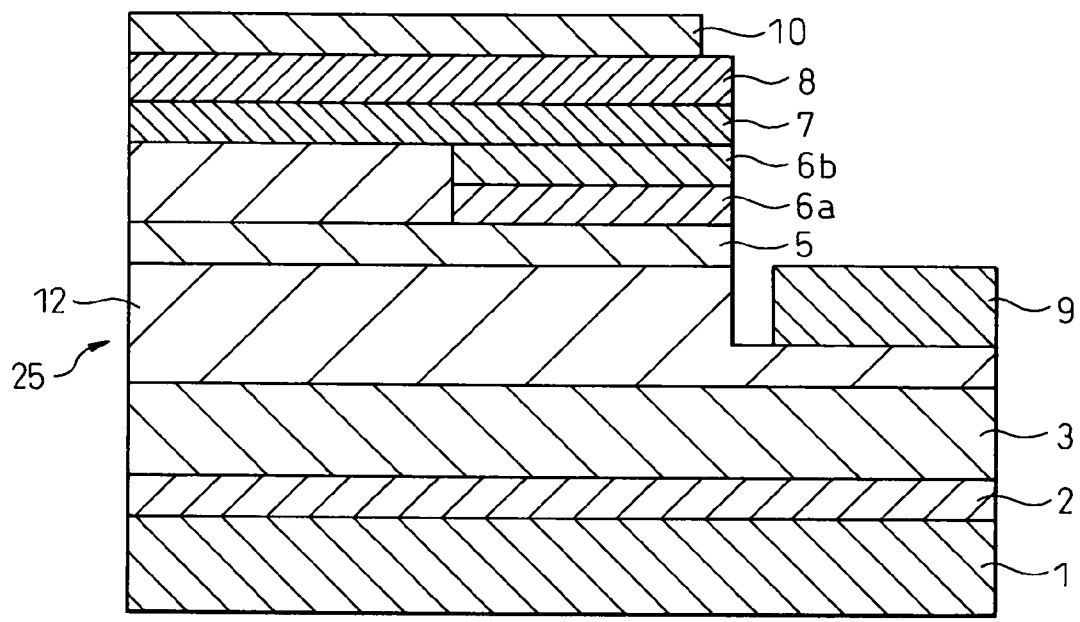
FIG. 5 shows an epitaxial laminated structure 24 for fabrication of an LED.

Instead of repeating 100 times a cycle of circulating tetramethylgermanium $((CH_3)_4Ge)$ for 18 seconds and interrupting the circulation for another 18 seconds, to form a 2.0 μm Ge-doped GaN layer 4 with a periodically varying Ge concentration, a GaN layer 12 evenly doped with Si at $7\times10^{18}$ cm$^{-3}$ was laminated. Next, an undoped n-type AlGaN clad layer 5, a multiple quantum well structure light emitting layer 6, a p-type $Al_{0.07}Ga_{0.93}N$ clad layer 7 and a p-type GaN contact layer 8 were formed in the same manner as Example 3, an electrode was formed under the same conditions as Example 3 and placed on a lead frame, and wire bonding was accomplished to fabricate an LED (FIG. 5: epitaxial laminated structure 25 for fabrication of LED). As a result, the forward voltage was 3.5 V with a forward current of 20 mA. Also, the center wavelength of the blue band light emitted during conduction of the 20 mA forward current was 460 nm. The light emitting intensity, measured using an ordinary integrating sphere as the characteristic during conduction of a forward current of 20 mA, was a light emitting intensity reduced by 20% compared to using 4 mW and Ge doping in the GaN layer 4.

INDUSTRIAL APPLICABILITY

The light emitting device of the invention employing a Ge-doped n-type Group III nitride semiconductor layer has low forward voltage and excellent light emitting efficiency.

The invention claimed is:

1. A Group III nitride semiconductor light emitting device having an n-type contact layer, a light emitting layer, and a p-type layer, composed of a Group III nitride semiconductor,
    wherein the n-type contact layer has a structure with periodic alternating lamination of a germanium (Ge)-added Group III nitride semiconductor layer and an undoped Group III nitride semiconductor layer,
    wherein the layer thickness of the Ge-added Group III nitride semiconductor layer is equal to or less than the layer thickness of the undoped Group III nitride semiconductor layer, and
    wherein the n-type contact layer has a resistivity of $1\times10^{-2}$ to $3\times10^{-3}$ Ωcm.

2. A Group III nitride semiconductor light emitting device according to claim 1, wherein the n-type contact layer has the compositional formula $Al_xGa_yIn_zN_{1-a}M_a$ (wherein $0\leq x\leq 1$, $0\leq y\leq 1, 0\leq z\leq 1, x+y+z=1$, M represents a Group V element other than nitrogen (N) and $0\leq a<1$).

3. A Group III nitride semiconductor light emitting device according to claim 1, wherein the Ge atom concentration in the Ge-added Group III nitride semiconductor layer is at least $1\times10^{17}$ cm$^{-3}$ and no greater than $1\times10^{20}$ cm$^{-3}$.

4. A Group III nitride semiconductor light emitting device according to claim 1, wherein the n-type Group III nitride semiconductor layer is situated between a substrate and the light emitting layer.

5. A Group III nitride semiconductor light emitting device according to claim 1, wherein the total layer thickness in the region in which the Ge atom concentration varies in a periodic manner is at least 0.1 µm and no greater than 10 µm.

6. A Group III nitride semiconductor light emitting device according to claim 1, wherein the layer thickness of one period in the region in which the Ge atom concentration varies in a periodic manner is at least 1 nm and no greater than 1000 nm.

7. An LED employing a Group III nitride semiconductor light emitting device according to claim 1.

8. A lamp employing a light emitting device according to claim 7.

9. A process for fabrication of a Group III nitride semiconductor light emitting device having a light emitting layer bonded to a crystal layer composed of an n-type or p-type Group III nitride semiconductor, the process being characterized in that during growth of the Ge-added n-type Group III nitride semiconductor layer, Ge atom is supplied to the reaction system in a periodically varying manner.

* * * * *